United States Patent
Borghs et al.

(10) Patent No.: US 6,576,505 B2
(45) Date of Patent: Jun. 10, 2003

(54) METHOD FOR TRANSFERRING AND STACKING OF SEMICONDUCTOR DEVICES

(75) Inventors: Staf Borghs, Kessel-Lo (BE); Eric Beyne, Heverlee (BE); Raf Vandersmissen, Wellen (BE)

(73) Assignees: Imec, VZW, Leuven (BE); Umicore, Brussels (BE)

( * ) Notice: Subject to any disclaimer, the term of this patent is extended or adjusted under 35 U.S.C. 154(b) by 0 days.

(21) Appl. No.: 09/772,195

(22) Filed: Jan. 29, 2001

(65) Prior Publication Data

US 2003/0040145 A1 Feb. 27, 2003

Related U.S. Application Data

(60) Provisional application No. 60/178,994, filed on Jan. 28, 2000.

(30) Foreign Application Priority Data

Nov. 25, 1999 (JP) .............................. 11-334971
Sep. 21, 2000 (JP) ....................... 2000-287191

(51) Int. Cl.⁷ ............................................ H01L 21/338
(52) U.S. Cl. ..................................... 438/167; 257/698
(58) Field of Search ................................ 438/172, 949, 438/423, 285, 167; 257/194, 191–192, 24–25, 698

(56) References Cited

U.S. PATENT DOCUMENTS

| 3,621,565 A | | 11/1971 | Sandstrom et al. ............. 29/590 |
| 4,771,017 A | * | 9/1988 | Tobin et al. ........ 148/DIG. 100 |
| 5,097,448 A | | 3/1992 | Segawa |
| 5,300,788 A | | 4/1994 | Fan et al. ...................... 257/13 |
| 5,356,831 A | * | 10/1994 | Calviello et al. ............ 117/105 |
| 5,391,501 A | | 2/1995 | Usami et al. .................... 437/7 |
| 5,432,356 A | * | 7/1995 | Imamura ..................... 257/191 |
| 5,472,914 A | * | 12/1995 | Martin et al. ...... 148/DIG. 135 |
| 5,675,295 A | | 10/1997 | Brebels et al. |
| 5,698,870 A | * | 12/1997 | Nakano et al. .............. 257/194 |
| 5,710,439 A | * | 1/1998 | Ohkubo ...................... 257/103 |
| 5,821,825 A | * | 10/1998 | Kobayashi .............. 331/108 C |
| 6,172,382 B1 | * | 1/2001 | Nagahama et al. ......... 257/103 |
| 6,184,066 B1 | * | 2/2001 | Chino et al. ................. 438/106 |
| 6,410,941 B1 | * | 6/2002 | Taylor et al. ................ 257/441 |

FOREIGN PATENT DOCUMENTS

| EP | 1 041 624 | 10/2000 | ........... H01L/21/98 |
| JP | 03/059898 | 3/1991 | |
| JP | 03/189992 | 8/1991 | |
| JP | 06/068677 | 3/1994 | |
| JP | 06/267280 | 9/1994 | |
| JP | 08/045299 | 2/1996 | |
| JP | 08/138399 | 5/1996 | |

OTHER PUBLICATIONS

A 31%–Efficient GaAs/Silicon Mechanically Stacked, MultiJunction Concentrator Solar Cell, Gee et al.

(List continued on next page.)

Primary Examiner—David Nelms
Assistant Examiner—David Vu
(74) Attorney, Agent, or Firm—Knobbe, Martens, Olson & Bear, LLP

(57) ABSTRACT

A method is presented in which an active element, e.g. a semiconductor device, is embedded in a passive circuitry formed on a low-cost substrate, having good dielectric properties. After forming the active element on a first substrate, the active elements are singulated and transferred to a second substrate. The active element is bonded to this second substrate and the portion of the first substrate, on which this active element is created, is removed selectively to the active element and the low-cost substrate. On this second substrate passive circuitry may be present or it can be formed after the attachment of the active element. The passive circuitry is interconnected to the active element or other components or dies present on the low-cost substrate.

27 Claims, 9 Drawing Sheets

Flip chip of the Ge grown transistor (21) on the In bonding layer (26).

OTHER PUBLICATIONS

Towards a 40%–Efficient Mechanically Stacked Two–Tandem Concentrator Solar Cell Grown on GaAs and InP., Beaumont et al.

W–band high–gain amplifier using InP dual–gate HEMT technology, K. van der Zanden et al., in Proc. InP and related materials, 1pp7,pp249–252.

Fabrication and characterization of Singlemode Polymeric Optical Waveguides, Daniel Schneider, Ph.D. dissertation university of Trandheim, Norway 1998.

Venkatasubramanian et al.; *An Inverted–Growth Approach to Development of an IR–Transparent, High Efficiency AlGaAs/GaAs Cascade Solar Cell*; Porceedings of the Photovoltaic Specialists Conference, Las Vegas; Oct. 7–11, 1991; pp. 93–98.

Topper et al.; *Embedding Technology—A Chip–First Approach Using BCB*; 1997 International Symposium on Advanced Packaging Materials Proceedings; Mar. 9–12, 1997; pp. 11–14.

Lenihan et al.; *Embedded Thin Film Resistors, Capacitors and Inductors in Flexible Polyimide Films*; 1996 Electronic Components and Technology Conference; May 28–31, 1996; pp. 119–124.

Hardingham et al.; *Ultrathin GaAs Space Solar Cell Devices*; Proceedings of the 25th IEEE PVSC; May 13–17, 1996; pp. 255–258.

\* cited by examiner

| | | |
|---|---|---|
| 7 nm | Si-doped In.53Ga.47As | 8 |
| 25 nm | In.52Al.48As | 7a |
| 5 nm  —δ— | In.52Al.48As | 7b |
| 15 nm | In.53Ga.47As | 6 |
| 5 nm   —δ— | In.52Al.48As | 5b |
| 100 nm | In.52Al.48As | 5a |
| 100 nm | In.57Al.43As - In.52Al.48As | 4 |
| 1000 nm | AlAs - In.57Al.43As | 3 |
| 500 nm | GaAs | 2 |
| | Ge | 1 |

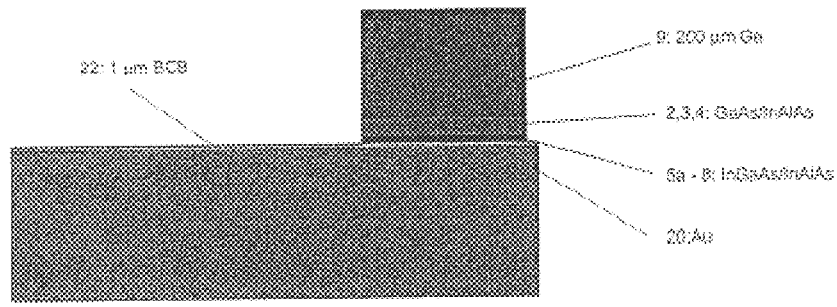
*Figure 3a: "Flip chip of HEMT on BCB adhesion layer (22) and curing of the BCB layer."*
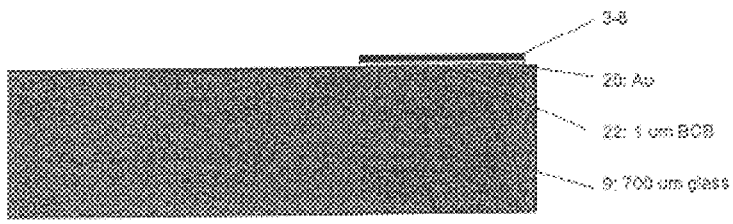
*Figure 3b: "Thinning of the HEMT device to about 3 μm using a plasma and next a chemical etch."*
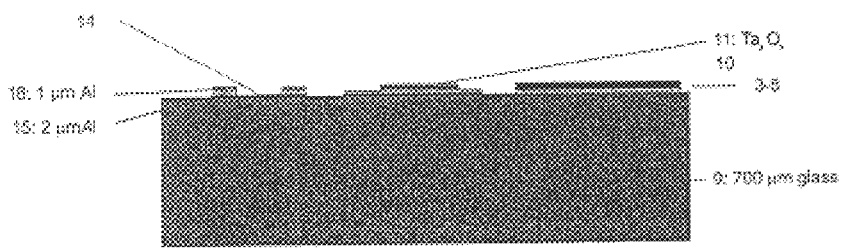
*Figure 3c: Integration of the TaN (14) resistors and Ta (11-10) capacitors. The HEMT device is protected by the bottom Al layer (15) during the processing.*

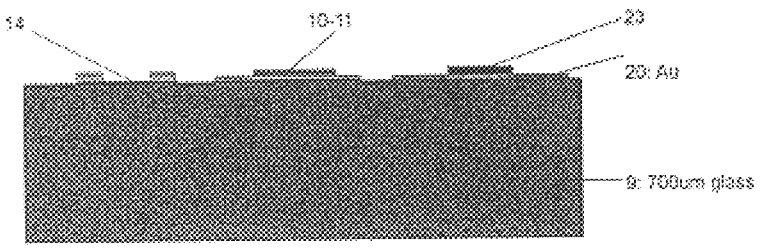

Figure 3d: Etching of the InAlAs/InGaAs (5a-8) to free the Au contacts (20). Only the active area (23) of the HEMT remains. The Ta (21-10) and TaN (14) are protected by a resist layer (not shown) during the etching.

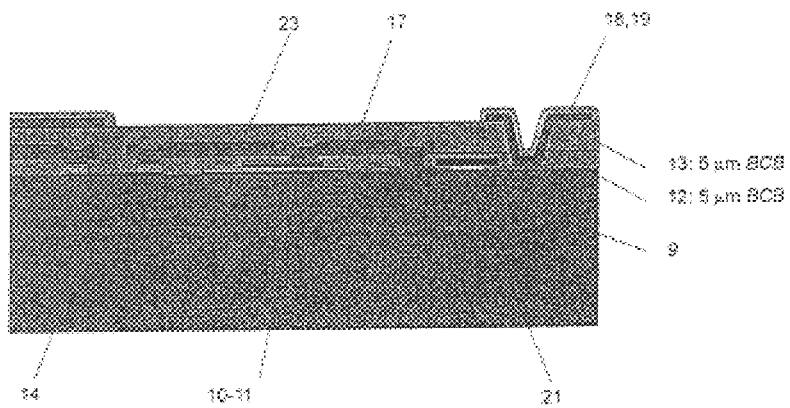

Figure 3e: Contacting of the transistors (21) and construction of the MCM-D passive microwave circuit: resistors (14), capacitors (10-11), low loss Cu transmission lines (23). All elements are isolated by 2 layers of 5 μm BCB (12,13)

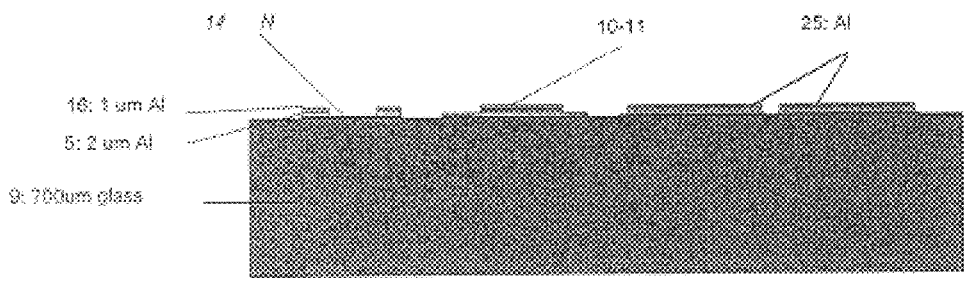
*Figure 4a: First step in the build-up of the MCM-D substrate with integrated TaN (14) resistors and Ta (11-10) capacitors. The Al bonding pads (25) for realising the In bonding between the HEMT and the MCM-D substrate are also realised.*
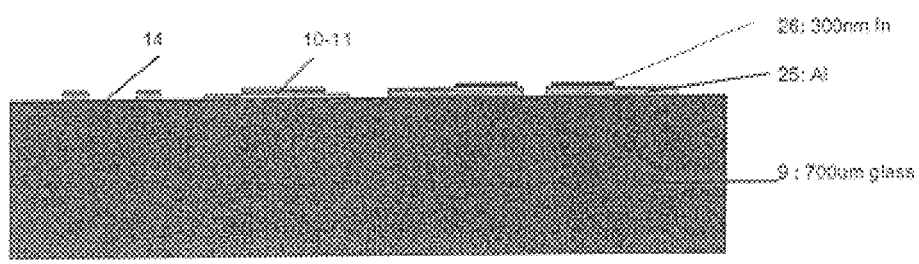
*Figure 4b: Evaporation and patterning of a thin In bonding layer (26).*
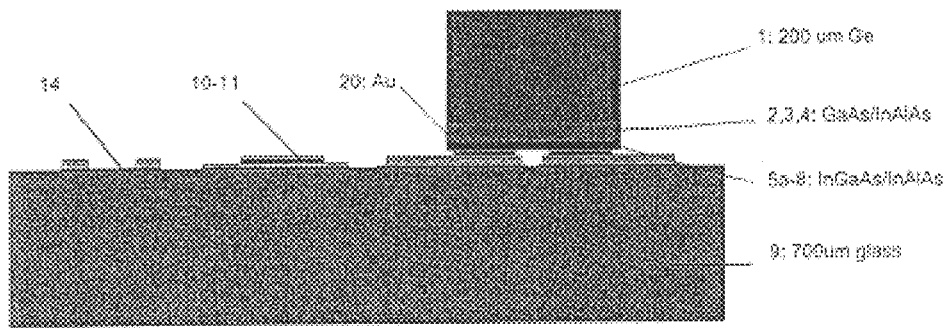
*Figure 4c: Flip chip of the Ge grown transistor (21) on the In bonding layer (26).*

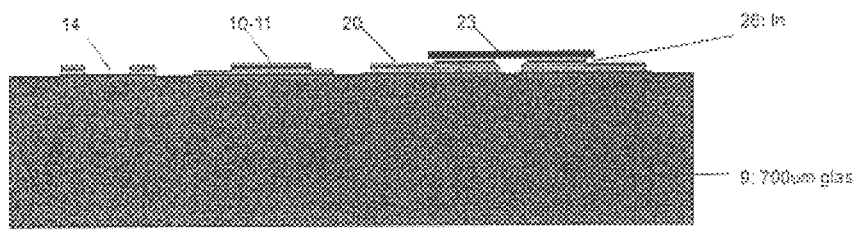

*Figure 4d: Etching of the Ge(1) and GaAs (2) layers to thin the active wafer to about 3 µm. The Ta and TaN structures are protected during this etch step, e.g. by a resist layer (not shown). The contact pads (20) are exposed and available for backside contacting by the MCM-D metal layers. The active area (23) of the HEMT is defined.*

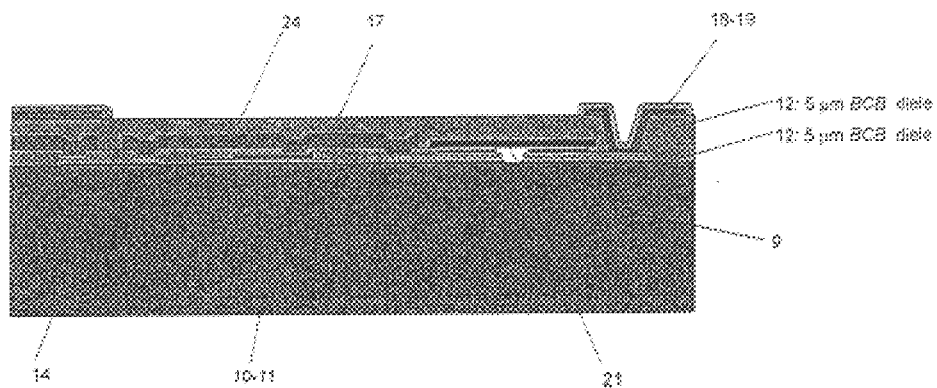

*Figure 5: Contacting of the transistors and construction of the MCM-D passive microwave circuit.*

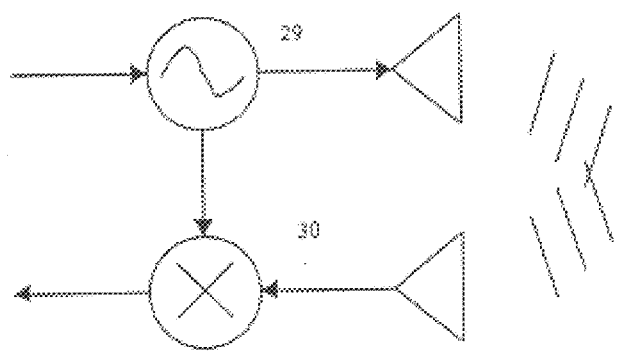
*Figure 6: System build-up for a short range radar system.*
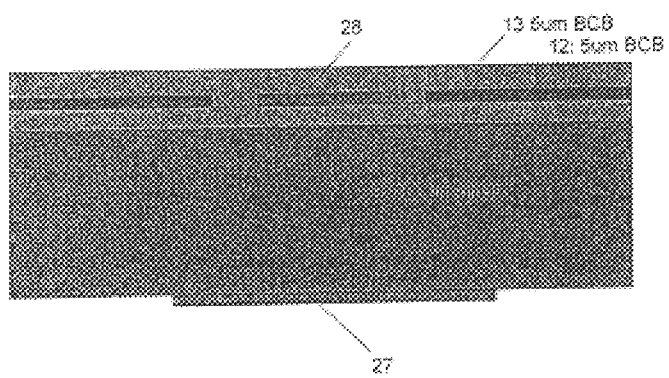
*Figure 7: Microwave patch antenna (27) in MCM-D technology. An extra back side processing step is used for the patch, which is fed by a coplanar line (28) defined at the opposite side of the MCM-D substrate. Microwave antennas at 26 GHz are realised with less then 1% deviation in resonance frequency and good radiation patterns.*

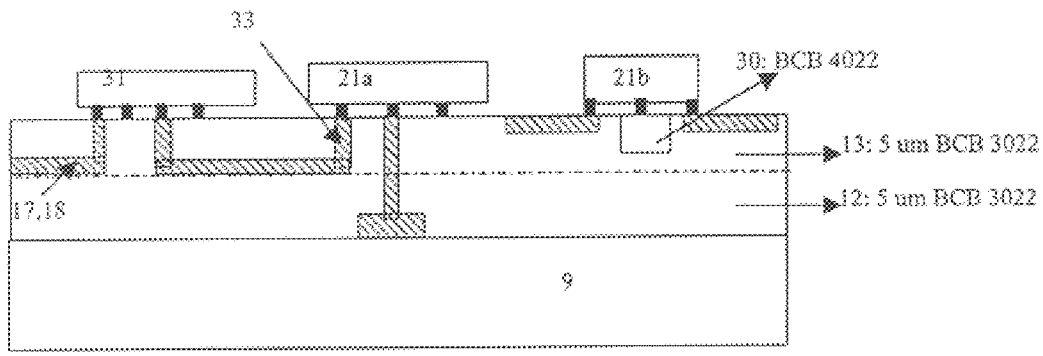
Figure 8: integration of several devices, processed in the same or different technology, on a MCM (-D) substrate
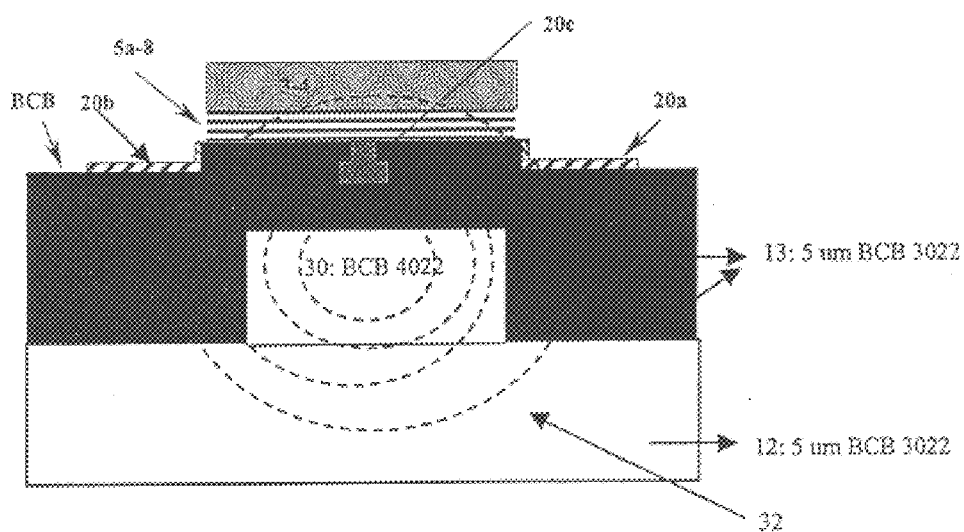
Fig 9: cross section of a photodetector HEMT and optical waveguide

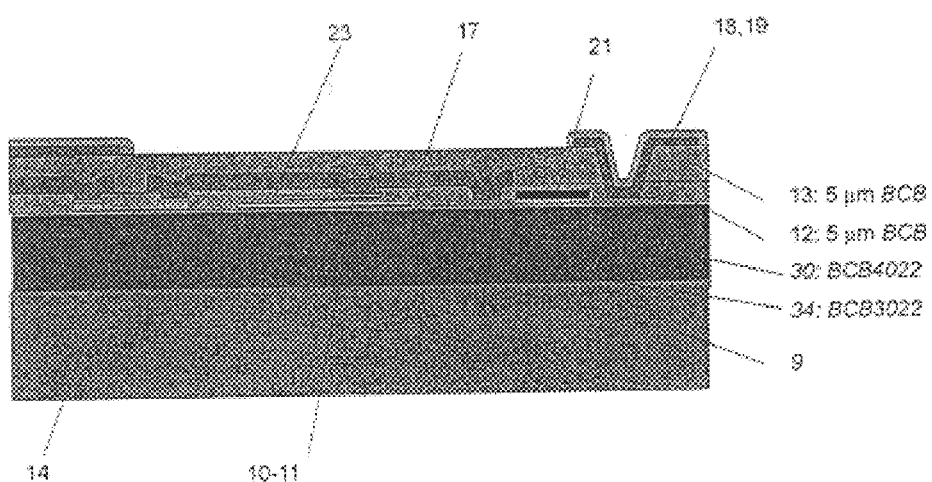
Figure 10: first the BCB layers forming the optical waveguide are deposited and patterned. Afterwards processing can continue as in fig 3a-3. Layer 34 can be used as glue layer (22)
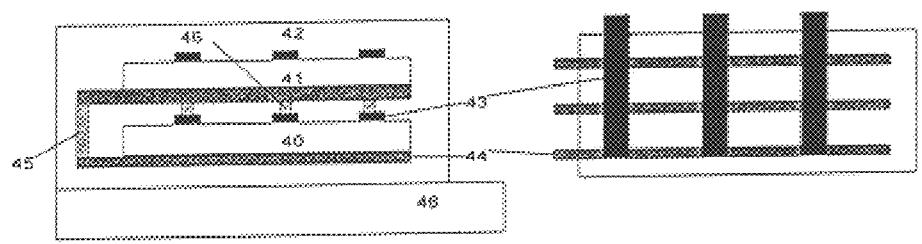
Figure 11: tandem solar cell
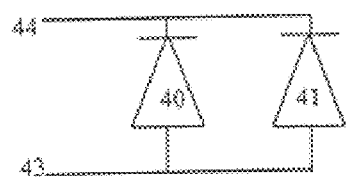
Figure 12: electrical equivalent scheme of figure 11

METHOD FOR TRANSFERRING AND STACKING OF SEMICONDUCTOR DEVICES

RELATED APPLICATION INFORMATION

This application claims claims priority under 35 U.S.C. §119(e) to U.S. Provisional Application Serial No. 60/178,994, filed Jan. 28 $^{th}$ 2000, which is hereby incorporated by reference.

BACKGROUND OF THE INVENTION

1. Field of the Invention

The present invention relates to semiconductor devices, in particular to micro- or millimeterwave devices, embedded in an interconnect platform and manufacturing methods thereof.

2. Background of the Invention

The increasing usage of MMIC's (Monolithic Millimeterwave Integrated Circuit) in application fields such as the automotive industry is a strong driving force to develop alternative technologies with equal performance level but at lower cost. In standard MMIC technology the active element and the passive circuitry are formed in a monolithic way on a single substrate. This substrate must fulfil all the requirements with respect to e.g. the growth of semiconductor layers, high frequency performance, manufacturability and cost. An alternative technology is the hybrid integration of individual HEMT's (High Electron Mobility Transistor) with passive circuitry on low-cost substrates. In this way, the epitaxial area consumption per chip can be reduced dramatically.

In U.S. Pat. No. 5,675,295, hereby incorporated by reference, a microwave oscillator device for a receiver or a transmitter is described. This oscillator device comprises a high frequency oscillating circuit including an active device. The active device, i.e. a vertical diode, is formed on an undoped, semi-insulating, GaAs substrate. This manufacturing method comprises the steps of depositing a sacrificial layer on this GaAs substrate, followed by the deposition on this sacrificial layer and subsequent patterning of the layers, e.g. semiconductor layers, which compose the active device. An example of a manufacturing method of such active elements can be found in "W-band high-gain amplifier using InP dual-gate HEMT technology", by K. van der Zanden et al, in Proc. InP and related Materials, 1pp7, pp249–252, hereby incorporated by reference. The thus formed vertical active device (see FIG. 1b) is then separated from the undoped GaAs substrate e.g. by applying the epitaxial lift-off (ELO) technique wherein the sacrificial layer, sandwiched between the active device and the semi-insulating substrate, is selectively etched. After separation the active device is transferred to and attached on a second substrate. This second substrate can be any other substrate, comprising passive circuitry and interconnects.

SUMMARY OF THE INVENTION

One aspect of the invention is directed to providing high frequency devices comprising at least one semiconductor element interconnected to a passive circuitry. Thus, a preferred embodiment provides a method of fabricating a semiconductor device, comprising depositing two or more layers of semiconducting material onto a first substrate to form a first semiconductor stack, singulating said first semiconductor stack to form a first group of singulated semiconductor stacks, wherein said first group is comprised of at least a first singulated semiconductor stack having a top semiconducting layer, a bottom first substrate layer, and an inner semiconducting layer in contact with said bottom first substrate layer, providing a second substrate having a first conductive layer and a first bonding material deposited thereon, selecting said first singulated semiconductor stack from said first group, attaching said upper semiconducting layer of said first singulated semiconductor stack to said conductive layer to form a second semiconductor stack, and removing said two or more layers of semiconducting material in said second semiconductor stack from said first substrate layer to thereby form a semiconducting device in which said inner semiconducting layer is exposed. In a further preferred embodiment, a tandem cell cell is provided by employing as the second substrate a semiconductor having a band gap that is different from the band gap of said second semiconductor stack.

In another preferred embodiment, a method fo fabricating a semiconductor device is provided, comprising depositing a sacrificial layer onto a first substrate, depositing two or more layers of semiconducting material onto said sacrificial layer to form a first semiconductor stack, singulating said first semiconductor stack to form a first group of singulated semiconductor stacks, wherein said first group is comprised of at least a first singulated semiconductor stack having a top semiconducting layer, a bottom first substrate layer, and an inner semiconducting layer in contact with said bottom first substrate layer, providing a second substrate having a first conductive layer and a first bonding material deposited thereon, selecting said first singulated semiconductor stack from said first group, attaching said upper semiconducting layer of said first singulated semiconductor stack to said conductive layer to form a second semiconductor stack, and removing said two or more layers of semiconducting material in said second semiconductor stack from said first substrate layer to thereby form a semiconducting device in which said inner semiconducting layer is exposed.

Another aspect of the invention is directed to providing a manufacturing method for hybrid integration of individual semiconductor devices with passive circuitry. A preferred embodiment thus provides a method of fabricating a hybrid device comprised of an optical waveguide and a semiconductor device, comprising depositing two or more layers of semiconducting material onto a first substrate to form a first semiconductor stack, singulating said first semiconductor stack to form a plurality of singulated semiconductor stacks, each having an top semiconducting layer and a bottom first substrate layer, providing a second substrate having an optical waveguide deposited thereon, attaching said upper semiconducting layer of said singulated semiconductor stack to said optical waveguide to form a hybrid stack, and removing said two or more layers of semiconducting material in said second hybrid stack from said first substrate layer.

The present invention may provide the advantage of an easy transfer of single semiconductor devices from their original substrate to a second substrate. The proposed process of transferring the semiconductor devices offers an improved handling and alignment towards the second substrate of the devices. The proposed transfer method is very robust.

The present invention can provide the advantage of an improved stacking of semiconductor slices to obtain tandem solar cells.

The present invention can provide the advantage that, during the process of hybrid integration, the active side of the semiconductor element is protected and remains essentially unaffected.

The present invention can provide the advantage of re-using the original substrate after the active device is transferred to a second substrate.

The present invention provides an easy and highly accurate substrate removal, which is a large advantage for subsequent processing, and still maintains a high level of performance. In combination with the limited environmental load compared to As, this makes Ge for these specific applications a more attractive substrate material than GaAs.

The present invention combines the advantages of a good growth substrate with a high performance active microwave circuit.

The present invention can offer the advantage of combining MCM-D technology and HEMT technology yielding both high frequency devices and optical devices on the same substrate. This substrate comprises the optical waveguide forming an optical interconnect between different components or circuits or parts thereof present on this substrate.

The present invention can provide the advantage of an improved and easier stacking of semiconductor slices to obtain tandem solar cells.

DESCRIPTION OF THE DRAWINGS

In relation to the appended drawings the present invention is described in detail. All drawings are intended to illustrate some aspects and embodiments of the present invention. Devices and fabrication steps are depicted in a simplified way for reason of clarity. Not all alternatives and options are shown and therefore the invention is not limited to the content of the given drawings. It will be apparent to a person skilled in the art that there are several other equivalent embodiments or other ways of executing the present invention, the spirit and scope of the present invention being limited only by the terms of the appended claims.

FIGS. 3a–e: method of embedding an active device, e.g. HEMT, in an interconnect technology, e.g. MCM-D, comprising passive devices according to one embodiment of the present invention.

FIGS. 4a–d: method of embedding an active device, e.g. HEMT, in an interconnect technology, e.g. MCM-D, comprising passive devices according to another embodiment of the present invention.

FIG. 5: contacting of the transistors and construction of the MCM-D passive microwave circuit.

FIG. 6: schematic representation of system build-up for a short range radar system, illustrating the industrial application of the present invention.

FIG. 7: Schematic cross section of a microwave patch antenna in MCM-D technology, illustrating the industrial application of the present invention.

FIG. 8: integration of components, processed in the same or different technology, on a MCM (-D) substrate, illustrating an embodiment of the present invention FIG. 9: cross section of a photodetector HEMT and an optical waveguide illustrating an embodiment of the present invention FIG. 10: formation of an optical waveguide in a stack of BCB layers and further embedding of a photodetector HEMT according to an embodiment of the present invention FIG. 11: schematic cross section of a tandem solar cell according to one embodiment of the invention FIG. 12: electrical equivalent scheme of the cross section given in FIG. 11.

DETAILED DESCRIPTION

In relation to the appended drawings the present invention is described in detail in the sequel. It is apparent however that a person skilled in the art can imagine several other equivalent embodiments or other ways of executing the present invention, the spirit and scope of the present invention being limited only by the terms of the appended claims.

Figures 1A, 1B:
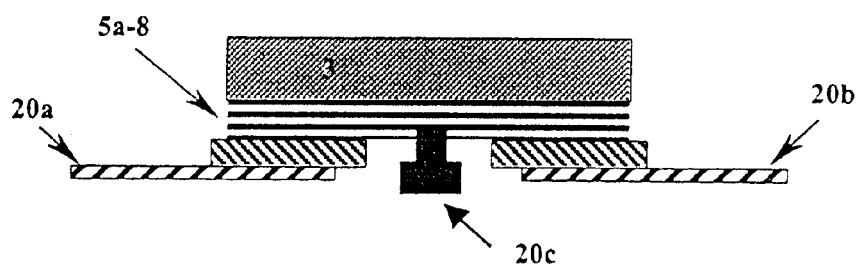
FIGS. 1a and 1b: prior art cross section of a metamorphic HEMT structure grown on a Ge-substrate. a: cross section through device stack after deposition, b: cross section through device after removal of the Ge substrate and buffer layer

FIG. 1a gives a schematic overview of an active device, in this example a metamorphic HEMT structure with a graded InAlAs buffer and a double doped heterostructure, grown on a Ge-substrate. Such a stack of semiconductor layers can be grown on a variety of substrates such as Ge, GaAS, InP. Preferably Ge is used as the substrate as such substrate is very well applicable for growing InGaAs/InAlAs High Electron Mobility Transistors. Ge substrates are more advantageous than GaAs or InP substrates as these Ge substrates can be larger, are less fragile and less expensive. The high dielectric loss of Ge substrates for combining passive circuitry and active devices has a number of disadvantages: e.g. the cut-off frequency $f_T$ of the transistors drops to 45 GHz whereas comparable devices formed on GaAs or InP substrates can have a cut-off frequency $f_T$ of 90 GHz or higher. Moreover the losses of the transmission lines in the microwave circuits formed on Ge substrates become very large.

Figure 2:
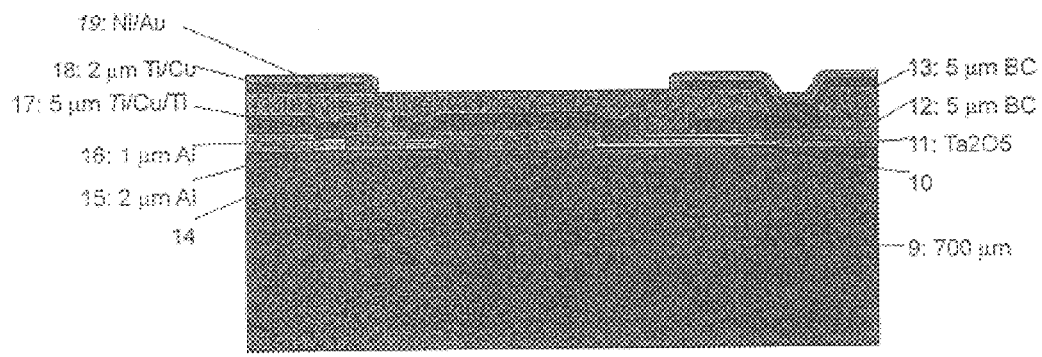
FIG. 2: prior art schematic representation of an MCM-D technology

Various low-cost substrates can be used as a second substrate. A very suitable and known technology platform is the so-called MCM-D technology, which is also used in U.S. Pat. No. 5,675,295. MCM-D (Multi Chip Module-Dielectric) is a thin film technology in which alternating thin layers of insulating and conductive materials are deposited on a low-cost substrate, such as glass or sapphire. The metal lines in one conductive layer run perpendicular to the metal layers in another conductive layer. In this MCM-D technology, fixed passive components, such as resistors or capacitors, can also be formed simultaneously, while on top of the MCM-stack chips can be die-bonded by means of solder bump or flip chips techniques. Openings, i.e. vias, in these insulating layers are created to interconnect the passive components, the chips and the wiring layers. Compared to the standard MMIC technology, MCM-D technology offers a substrate with lower dielectric losses at lower cost. The cross section given in FIG. 2 shows an example of such low-cost substrate technology. This MCM-D technology consists of a build-up of 3 metal layers (15-16, 17, 18) embedded in BCB (12, 13), a dielectric material with low dielectric constant ($\in_r$=2.7) and low dielectric losses (loss angle tan$\delta$=8 $10^{-4}$). The complete structure is built on a low dielectric loss glass substrate (9). During the built-up of the stack of conductive and dielectric layers, passive components are formed. This metal-dielectric multilayer stack comprises TaN resistors (14), $Ta_2O_5$ capacitors (11–10), inductors and distributed microwave components. TaN resistors are mainly used as high-frequency 50 ohm terminations. Ta capacitors are used for realising large capacitors. For small capacitors a parallel plate BCB capacitor can be used. Both the TaN resistors and the Ta capacitors can be used for realizing a stable biasing of active circuitry.

In a first aspect of the invention the integration of ultra-thin semiconductor devices with passive circuitry on a low-cost substrate with good dielectric properties is disclosed. The semiconductor device comprises a stack of layers, e.g. semiconductor layers, grown on first substrate. After forming the semiconductor device this first substrate is singulated and the dies are transferred to a second substrate. After removal of the first substrate the attached dies are interconnected on this second substrate with passive elements, thereby employing a interconnect technology. Finally an active microwave circuit is obtained.

In a preferred embodiment of this first aspect a metamorphic HEMT grown on a Ge-substrate is embedded in an MCM-D interconnect platform. This embodiment uses backside contacting of the HEMTs to the MCM-D lines, as illustrated in FIGS. 3(a–e). This technique combines the advantages of a less expensive, good growth substrate with a high performance active microwave circuit.

The Ge substrate measures 50×50 mm$^2$ and has a thickness of 200 $\mu$m. Although highly Ge resistive substrates are available, a Ge substrate (1) having a 50 ohm cm resistivity is chosen from a cost point of view, releasing the constraints on material purity. Since the Germanium only acts as a sacrificial substrate, as will be later on explained, its conductivity is not significant for the performance of the final device or circuit. The MBE (Molecular Beam Epitaxy) grown layer structure is depicted in FIG. 1a and is very similar to what can be grown on GaAs. After an initial GaAs nucleation layer (2) the buffer (3) is graded from AlAs to In$_{0.57}$Al$_{0.43}$As, followed by an inverse step to In$_{0.52}$Al$_{0.48}$As to form a stress relaxation layer (4). The double Si δ-doped structure (upper doping level is 5·10$^{12}$ cm$^{-2}$ and the lower is 2.5·10$^{12}$ cm$^{-2}$) is grown lattice matched on this virtual substrate. The substrate is called virtual as the lattice constant of GaAs, grown on the Ge substrate, is transformed into the lattice constant of InP trough the relative thick buffer layer (3). The HEMT active layers are formed as if these layers were grown on a full InP substrate. This stack of HEMT active layers comprises a buffer (5a), a spacer (5b), the channel (6), followed by spacer (7b) and a Schottky layer (7a). Finally a capping layer of a Si-doped In$_{0.53}$Ga$_{0.47}$As layer (8) for ohmic contact formation is deposited. The active area of the HEMT device is obtained by wet mesa etching, deposition and alloying of Ni/Au/Ge ohmic contacts (20: 20a, 20b) and Cr/Au c-gate metal deposition (20c). The Ge substrate is singulated to yield individual devices or array of devices. As contact levels are applied in this step of the processing, some devices can be interconnected into an array. FIG. 1b shows a cross section of the HEMT device after removal of the Ge substrate and the buffer layer. The contact pads to source (20a) and drain (20b) are free and can be contacted from the backside. In the prior art, e.g. U.S. Pat. No. 5,675,295, the device, as shown in FIG. 1b, would be ready for transfer to another substrate.

Although Ge can be used as substrate material e.g. for the growth of metamorphic devices with a high level of performance and a DC behavior comparable to GaAs-based devices, its less likely to use Ge as substrate for the construction of performant RF circuits. Because the cut-off frequency f$_T$ and the maximum oscillation frequency f$_{max}$ for the Ge based devices (respectively 45 and 68 GHz) are low compared to similar GaAs based devices (f$_T$=90 and f$_{max}$=130 GHz), there is a need for to remove the Ge-substrate to expel capacitive parasitics originating from the conductive Ge. In this preferred embodiment an MCM-D substrate is used, e.g. glass, as such substrate has a low-cost and good dielectric characteristics. The main disadvantage of such technology platform is the absence of active material e.g. to construct high frequency components such as microwave circuits. To realise complete microwave circuits active components are added to the passive microwave MCM-D by using flip chip.

The InAlAs/InGaAs HEMTs are integrated in the MCM-D stack by by flip chip connecting the HEMT (21) on the glass substrate (9), as illustrated by FIG. 3a. After device formation and singulation of the Ge-substrate into single HEMT devices, the HEMT devices (21) on top of the Ge-substrate (1) are transferred to the MCM-D substrate (9). As the, relative thick, Ge-substrate (9) is still present during this transfer the handling of the HEMT devices becomes very easy and the transfer process is more suitable for industrial application.

A thin non-cured BCB layer (22) is used for the adhesion between the glass substrate (9) and the HEMT (21). Preferably a thin layer, e.g. 1 $\mu$m or less, of BCB is deposited by spin-coating on top of the substrate (9). The HEMT device (21) is upward-down or flip chip connected to this adhesion layer (22). The BCB layer is then cured to improve the adhesion further (FIG. 3a). A BCB layer is used as adhesion layer as it is compatible with the other materials used in the MCM-D technology.

After attaching the stack of the HEMT device and the Ge-substrate to the MCM-D substrate the Ge substrate (1) is next removed in a CF$_4$-O$_2$ plasma etch (see FIG. 3b). A highly selective etch process has been developed, based on CF$_4$ and O$_2$ plasma Reactive Ion Etching (RIE), being a straightforward method compared to GaAs thinning. The settings of this selective etching process are: CF$_4$ flow is 100 sccm, O$_2$ flow is 10 sccm and the pressure is 300 mTorr. The etching of the Ge-substrates takes place at 30° C. with 50 Watt RF input power. The etch rate of Ge typically is 3.5 $\mu$m/min, resulting in an etch time of about 60 minutes to remove the complete 200 $\mu$m thick substrate, leaving only the 2 $\mu$m thick epitaxial layer. Approximately 200 $\mu$m Ge is etched in 70 min, with a selectivity to the GaAs buffer layer (2) of about 1/100. The Ge can be reused by capturing the Ge from the reaction gass flow present at the exhaust of the RIE process chamber. The recycled Ge can be used to grown again Ge-substrates. As can be noticed in FIG. 4 the BCB layer, not covered by the HEMT stack, is also etched during the RIE step, but the glass substrate remains essentially unaffected. The GaAs buffer (2) is removed by a non-selective H$_2$SO$_4$—H$_2$O$_2$ solution. This wet etching step thins the HEMT device, including the contact pads, to about 3–5 $\mu$m, preferably less then 3 $\mu$m, and leads to the structure of FIG. 3b. Only the InGaAs/InAlAs HEMT layers (3–8) and the Au contacts (20) remain. Such a thin structure can be integrated in the MCM-D stack without detoriating the planarising properties of the MCM-D substrate and allows the further processing of the MCM-D stack and the fixation of chips on top of this MCM-D substrate. The step height created by the embedding of the transferred HEMT device is smaller than the thickness of the applied BCB layers.

The following steps are the realisations of the Ta and TaN structures on the MCM-D, e.g. used to form the resistor (14) and capacitors (10–11). The bottom Al layer (15) covers the HEMT structure and protects it during these processing steps (FIG. 3c).

After patterning the Ta and TaN structures a photoresist layer (not shown in FIG. 3d) is deposited and patterned to cover the Ta/TaN structures (14, 10) and the active area (23) of the transistor. By using a phosphoric acid solution only the active area of the transistor remains and the contacts (20: 20a, 20b), initially formed on the top of the HEMT stack before their transfer to the second substrate (9), become free (FIG. 3d). The last steps include the stacking and patterning of the BCB (12,13) and copper layers (17,18) for the realisation of the passive structures. The copper metallisation (17, 18–19) is also used for contacting the HEMT. This gives finally the active microwave MCM-D structure (FIG. 3e). The Ni/Au component layer (19) is formed and allows the bonding of chips or other components on the MCM-D stack. Chips can be attached to further process signals from and to the active microwave MCM-D structure.

In a second embodiment of this first aspect a metamorphic HEMT grown on a Ge-substrate is embedded in an MCM-D interconnect platform after forming resistors and capacitors. This second embodiment uses an optimized flip chip type of interconnection with Indium used as a bonding material, rather then as bump material, as illustrated in FIGS. 4(a–d) and 5.

An alternative integration of InAlAs/InGaAs HEMTs in MCM-D is realised by doing flip chip of the HEMT on the glass substrate using Indium (In) as a bonding material. This approach is illustrated in FIGS. 4(a–d) and 5.

First the TaN (14) and Ta layers (10–11) are realised using a standard MCM-D process. This process also realises the Al bottom contacts (25) for the HEMT device (FIG. 4a). A thin In layer (26) is evaporated and patterned on Al (FIG. 4b). The thin, e.g. 300 nm or less, In layer is used as mechanical and electrical interconnection layer between the MCM-D substrate and the HEMT. The HEMT (21) is put on the In bonding layer (26) by the flip chip bonder and subsequently heated to 150° C. (FIG. 4c). The Ge substrate (1) is next removed in a $CF_4$—$O_2$ plasma etch selective to the GaAs layer (2) as disclosed previously. The GaAs buffer is removed by a non-selective $H_2SO_4$—$H_2O_2$ solution as disclosed previously. The HEMT device is hence again thinned to about 3–5 µm or less and leads to the structure of FIG. 4d. The last steps include the stacking and patterning of the BCB (12,13) and copper layers (17,18–19) for the realisation of the passive structures. The copper metallisation is also used for contacting the HEMT. This gives finally the active microwave MCM-D structure shown in FIG. 5.

The hybrid integration as illustrated above can be used for a large number of applications in the microwave and even millimeter range. As an example the integration of two HEMT devices is given to obtain a short-range radar system which can be used in collision avoidance systems. In FIG. 6 an outline is given of a short range radar system based on frequency modulation techniques. An oscillator (29) can be tuned in frequency and sends a frequency modulated signal to the antenna that radiates in the front direction. The radiation is reflected at a metallic object like a car and arrives back at a second antenna. This received signal is mixed (30) with the sent signal to generate a low frequency beat signal which frequency is proportional to the distance and the incoming speed of the object. To generate a complete system in MCM-D the MCM-D technology is extended with a back-side processing step to generate a patch antenna (17) inside the MCM-D layout (FIG. 7). Such patch antennas can be used to radiate the frequency modulate signal or to detect the reflected signal. For the construction of the doppler radar in principle one HEMT is sufficient when one uses a self-oscillating mixer concept. In such structure this single HEMT is used for generating the microwave oscillation and the down conversion of the reflected signal at the same time. This circuit has however a trade-off between output power of the oscillator and noise generation in the mixer. This effectively limits the range of the radar to a couple of meters. By using two transistors, one for the oscillator (29) and one for the mixer (30), the biasing and matching of both devices can be optimized to get sufficient oscillator output power with a reasonable noise figure for the mixer. This is the topology given in FIG. 6. All microwave circuits, e.g. matching circuits, biasing circuits and antennas are realized in the MCM-D technology. The two HEMT devices can be integrated by flip chip according to one of the options outlined above. The quasi-monolithic technique according to one of the above options, by embedding and back-contacting the HEMTs, should eliminate the parasitic effects of the interconnection as much as possible and should result in much better results especially at the higher millimeter frequencies.

In a second aspect of the invention an optical interconnect system on the low-cost substrate is disclosed. The semiconductor devices grown on the first substrate can be transferred to the second substrate in which an optical waveguide is formed. The semiconductor devices are used as a optical receiver/transmitter to convert electrical signals into optical signals and vice versa.

As disclosed in previous embodiments HEMT devices can be integrated or embedded into a circuit which is defined on the MCM substrate or within the composing layers. The MCM technologies, e.g. MCM-D, offer a platform to combine different technologies, such as III-V or BiCMOS (31), allowing the integration of devices, each having optimized properties with respect to data processing and operation frequency, on a single substrate as shown in FIG. 8. As stated before, chips can be attached to the MCM-D stack to further process signals from and to the active microwave MCM-D structure, comprising the HEMT device. The exchange of data between the components in or on an MCM-D stack is normally done by electrical signals. If however this data transmission could be done by light signals, very high data transmission rates could be obtained. In order to perform such communication, "light channels" or "light waveguides" and "transducing devices" are required. The "light channels" will transport the light from one "transducing device" to another. The "transducing device" will transduce or convert the light signal received from the "light channel" into an electrical signal that can be further processed by normal electronic circuitry.

The "light channels" are created by forming a trench of a first material (core layer) in a substrate of a second material (cladding layer). Both materials have different optical characteristics, such as their refractive index n. A schematic cross-section of the operation of such light channel is given in FIG. 9. The light being transported in the first material (core) (30), will not be encapsulated completely within this first material but some part of the Electro-Magnetic (EM) wave (32: dashed circles), as light is an EM-signal, will extend outside this trench, in the cladding layer (13). This exponentially decaying part of the light wave is called the "evanescent field", as it is located outside the core of the light waveguide. The BCB (Benzo-Cyclo-Butene) layers (12, 13), used to electrically isolate the conductive layers in the MCM-D metal-dielectric stack, are available in different variants, each variant having different optical properties. An optical waveguide or light waveguide can be created making use of the difference in optical characteristics of the different variants of BCB. An overview of the optical properties of BCB is given in "Fabrication and Characterization of Singlemode Polymeric Optical Waveguides", by Daniel Schneider, Ph. D. dissertation university of Trondheim, Norway 1998. BCB can be used as a first material (core: 30), using the 4022 variant, and can be used as a second material (cladding: 13), using the 3022 variant. The first variant, 4022, is similar to a photosensitive resin and therefore can be exposed to light and being wet developed afterwards. The second variant 3022 is not light sensitive and has to be patterned using standard exposing and etching techniques. Normally this 3022 variant is used as dielectric layer in the MCM stack. The pattering of the BCB layers is done when via's, e.g. 33, are created to contact underlying metal levels. At this level or stage in the MCM-D processing simultaneously a trench can be formed outlining the optical waveguide. After removal of the resist used during this patterning step, the trench can be filled with the optical variant BCB4022. The filling can e.g. be done by spin-coating of the BCB material, followed by an etch-back of the BCB only leaving the trench filled with BCB4022. As BCB4022 has resin like properties, BCB4022 can be spin-coated on top of the bottom part (13a) of the cladding layer (13), exposed to light using a mask and wet developed to have only the optical waveguide (30) line remaining. Afterwards the remaining part (13b) of the cladding layer is deposited and the overall structure is planarized.

In the example illustrated in FIG. 8, the photoHEMT is placed on top of the MCM-stack and the optical waveguide is formed in the top BCB layer (13). Another approach is illustrated in FIG. 10. On top of the MCM-D substrate (9) the optical waveguide is created by first forming the stack of the cladding layer (34) comprising the optical waveguide (30). On top of this stack processing can continue as illustrated by FIGS. 3a–e.

A HEMT device has photosensitive properties, as for example the current between drain and source contacts of the HEMT can be modulated to a minor extent by incident light. No specific processing is therefore required to manufacture dedicated light transducers as such "light sensing transistor" is established simultaneously with and is equivalent to the other HEMT transistors, used e.g. in mixers (29) or down-converters (30) as explained above. Only the interconnection to such HEMT used as light-sensing device is different compared to a HEMT used as electronic device, but this only requires design effort and no change in processing technology. Both high frequency devices and optical devices can be formed on the same substrate, preferably MCM-D substrate, comprising the optical waveguide.

If a HEMT device is processed and transferred in an hybrid way on top of the MCM-D stack in a way similar to other embodiments of the present invention, the gate of the device (20c) can be located right on top of such "light channel" as shown in FIG. 9. As can be seen in this figure some of the light will be penetrating in the heterolayers (5a–8) of the devices and affect e.g. the gate leakage current. This penetrated light will be absorbed in these semiconductor layers and creates electron-hole pairs. A HEMT device consists of III-V compound semiconductor material.

In a second aspect of the invention the stacking of ultra-thin semiconductor devices to form tandem solar cells is disclosed.

This embodiment is a further illustration of the first embodiment. If semiconductor devices are grown on a first, sacrificial substrate, and then, after singulating, transferred to a second substrate, one can use this technique to obtain a stack of semiconductor slices. In tandem solar cells slices of semiconductor material having different band gaps are stacked. As each slice comprise a semiconductor or compound semiconductor material with a band gap different from the materials present in the other slices, each slice will be sensitive to a particular range of electro-magnetic radiation. Whereas standard silicon solar cells are only susceptible for light having energy quanta larger than the bandgap of silicon (1.1 ev), a tandem solar cell e.g. comprising a slice of silicon and a slice of GaAs can detect not only light in 1.1 eV wavelength range but also in larger wavelengths as the bandgap of GaAs is smaller (about 0.92 ev). The overall efficiency of such tandem solar cell is higher then of the single solar cell. The present invention allows the stacking of several slices of semiconductor material. FIG. 11 illustrates this embodiment. Both opposite sides of the semiconductor slices (40, 41) are contacted by a set of perpendicular metal wiring (44, 43) to contact opposite sides of the junctions formed in these semiconductor slices. The connect these two slices, each slice forming a p-n junction in series, the metal level in one direction at a given level is contacted with the metal wiring in the same direction at a higher level. The metal wiring (44) is contacted by openings (45) in the insulating layer (42). The metal wiring (43) is contacted by openings (46) in the insulating layer (42). The insulating layer electrically isolates the p-n junctions and the wiring. FIG. 12 gives the electrical equivalent scheme of the structure given in FIG. 11. It clearly illustrates the series connection of the p-n junctions. The stack given in FIG. 11 can be formed using other embodiments of the present inventions. The semiconductor slice (40) can be grown on another substrate to yield the desired p-n junction. This substrate can be singulated into a slice having the desired dimensions. The device can be transferred to a second substrate (46) and attached hereto, e.g. by using a BCB adhesion layer. As disclosed in other embodiments the first substrate on which this semiconductor slice was formed will be removed, e.g. during a dry etch processing step. Metal wiring can be formed before or after attaching the die (40). A second BCB layer is deposited on top of the first metal wiring (44) and on top of the slice (40). A second metal wiring (43) in a direction substantially perpendicular to the direction of the first metal wiring. This second metal wiring contacts the opposite side of the p-n junction formed in the semiconductor slice. Again a layer of BCB is deposited to electrically isolate the different levels of metal wiring and to act as a glue layer to fix a second slice (41) transferred to this stack. The processing sequence disclosed above can be repeated. Openings are formed in the dielectric layers (42) to connect the appropriate levels of metal wiring to obtain e.g. a series or a parallel connection of the devices.

What is claimed is:

1. A method of fabricating a semiconductor device, comprising depositing two or more layers of semiconducting material onto a first substrate so as to form a first semiconductor stack;

singulating said first semiconductor stack to form a first group of singulated semiconductor stacks, wherein said first group is comprised of at least a first singulated semiconductor stack having an upper semiconducting layer, a lower first substrate layer, and an inner semiconducting layer in contact with said lower first substrate layer;

providing a second substrate having a first conductive layer and a first bonding material deposited thereon;

selecting said first singulated semiconductor stack from said first group;

attaching said upper semiconducting layer of said first singulated semiconductor stack to said first conductive layer of said second substrate so as to form a second semiconductor stack; and removing said first substrate layer and one or more layers of said two or more layers of semiconducting material from said second semiconductor stack so as to form a semiconducting device wherein said inner semiconducting layer is exposed.

2. The method of claim 1, wherein said second substrate is glass.

3. The method of claim 1, wherein said second substrate is a multi chip module dielectric stack.

4. The method of claim 1, wherein said first bonding material is an organic polymer.

5. The method of claim 1, wherein said first singulated semiconductor stack is a high electron mobility transistor.

6. The method of claim 1, wherein said removing further comprises selectively etching said first substrate.

7. A method of fabricating a hybrid device comprised of an optical waveguide and a semiconductor device, said method comprising:

depositing two or more layers of a semiconducting material onto a first substrate so as to form a first semiconductor stack;

singulating said first semiconductor stack to form a plurality of singulated semiconductor stacks, each having an upper semiconducting layer and a lower first substrate layer;

providing a second substrate having an optical waveguide deposited thereon;

attaching said upper semiconducting layer of said singulated semiconductor stack to said optical waveguide to form a hybrid stack; and removing said first substrate layer and one or more layers of said two or more layers of said semiconducting material from said hybrid stack.

8. The method of claim 7, wherein said second substrate is a multi chip module dielectric stack.

9. The method of claim 7, wherein said singulated semiconductor stack is a high electron mobility transistor.

10. The method of claim 7, wherein said removing comprises selectively etching said first substrate.

11. A method of fabricating a semiconductor device, comprising:

depositing a sacrificial layer onto a first substrate;

depositing two or more layers of semiconducting material onto said sacrificial layer to form a first semiconductor stack;

singulating said first semiconductor stack to form a first group of singulated semiconductor stacks, wherein said first group is comprised of at least a first singulated semiconductor stack having an upper semiconducting layer, a lower first substrate layer, and an inner semiconducting layer in contact with said bottom first substrate layer;

providing a second substrate having a first conductive layer and a first bonding material deposited thereon;

selecting said first singulated semiconductor stack from said first group;

attaching said upper semiconducting layer of said first singulated semiconductor stack to said conductive layer to form a second semiconductor stack; and removing said first substrate layer and one or more layers of said two or more layers of semiconducting material from said second semiconductor stack so as to form a semiconducting device wherein said inner semiconducting layer is exposed.

12. The method of claim 11, wherein said second substrate is glass.

13. The method of claim 11, wherein said second substrate is a multi chip module dielectric stack.

14. The method of claim 11, wherein said first bonding material is an organic polymer.

15. The method of claim 11, wherein said first singulated semiconductor stack is a high electron mobility transistor.

16. The method of claim 11, wherein said removing further comprises selectively etching said sacrificial layer.

17. A method of producing a plurality of semiconductor devices, comprising:

forming a stack of semiconductor layers on a first substrate;

singulating said stack of semiconductor layers and said first substrate, so as to obtain a plurality of sub-parts;

attaching at least one of said sub-parts to a second substrate, wherein said second substrate is in contact with said singulated stack of semiconductor layers;

removing from each of said sub-parts attached to said second substrate a singulated portion of said first substrate so as to form a semiconductor device on said second substrate.

18. The method of claim 17, further comprising forming resistors and capacitors on said second substrate.

19. The method of claim 17, further comprising forming interconnects on said second substrate.

20. The method of claim 17, wherein said second substrate is a multi-chip module dielectric stack.

21. The method of claim 17, wherein said semiconductor device formed on said second substrate is a high electron mobility transistor.

22. The method of claim 17, wherein said semiconductor device formed on said second substrate is an active microwave circuit.

23. The method of claim 17, wherein said first substrate is germanium substrate.

24. The method of claim 23, further comprising removing said germanium substrate in a CF4-O2 plasma etch.

25. The method of claim 17, further comprising forming an optical waveguide in said semiconducting device.

26. The method of claim 17, further comprising:

forming an interconnect pattern and dielectric isolation;

forming a second semiconductor device on top of said first semiconductor device according to the method of claim 17.

27. The method of claim 1, wherein said second substrate is a semiconductor having a band gap different from that of said second semiconductor stack.

* * * * *